United States Patent [19]

Stevens

[11] Patent Number: 4,759,950

[45] Date of Patent: Jul. 26, 1988

[54] METHOD FOR METALLIZING FILAMENTS

[75] Inventor: Ward C. Stevens, New Fairfield, Conn.

[73] Assignee: Advance Technology Materials, Inc., New Milford, Conn.

[21] Appl. No.: 913,000

[22] Filed: Sep. 26, 1986

[51] Int. Cl.$^4$ .......................... B05D 3/06; C23C 16/16
[52] U.S. Cl. ..................................... 427/55; 427/252; 427/255; 427/255.5; 427/376.2; 427/387; 427/404; 427/419.2
[58] Field of Search ................ 427/55, 252, 255.1, 427/255, 255.5, 404, 419.2, 376.2, 397.7, 387

[56] References Cited

U.S. PATENT DOCUMENTS

| | | | |
|---|---|---|---|
| 2,332,309 | 10/1943 | Drummond | 427/252 |
| 2,847,330 | 8/1958 | Toulmin | 427/252 |
| 3,355,318 | 11/1967 | Jenkin | 427/252 |
| 3,867,183 | 2/1975 | Cole | 427/252 |
| 4,096,823 | 6/1978 | Schladitz | 427/252 |
| 4,097,624 | 6/1978 | Schladitz | 427/252 |
| 4,231,900 | 11/1980 | Kato et al. | 427/404 |
| 4,259,409 | 3/1981 | Arnold | 427/404 |
| 4,321,073 | 3/1982 | Blair | 427/353 |

FOREIGN PATENT DOCUMENTS

| | | | |
|---|---|---|---|
| 60-65179 | 4/1985 | Japan | 427/404 |
| 749302 | 5/1956 | United Kingdom | 427/252 |

OTHER PUBLICATIONS

"Gaseous Plating", Metal Finishing, pp. 79 and 80, Oct. 1949.

Brinker, C. J., et al., "Sol-Gel Transition in Simple Silicates", *Journal of Non-Crystalline Solids,* 48, 1982, pp. 47-64, North-Holland Publishing Company.

Dislich, H., "Glassy and Crystalline Systems from Gels: Chemical Basis and Technical Application", *Journal of Non-Crystalline Solids,* 57, 1983, pp. 371-388, North-Holland Publishing Company.

Nogami, M., et al., "Glass Formation Through Hydrolysis of Si(OC$_2$H$_5$)$_4$ with NH$_4$OH and HCl Solution", *Journal of Non-Crystalline Solids,* 37, 1980, pp. 191-120, North-Holland Publishing Company.

*Primary Examiner*—Sadie L. Childs
*Attorney, Agent, or Firm*—Steven J. Hultquist

[57] ABSTRACT

A method for metallizing a filament, wherein the filament is initially coated with a sol gel dispersion of polysilicate, titania, or alumina, and after drying at elevated temperature to form a porous interlayer coating on the filament, a nickel coating is deposited thereon from gaseous nickel carbonyl in a metallizing zone. The gaseous nickel carbonyl is produced in a fluidized bed of particulate nickel through which carbon monoxide make-up and at least a portion of the effluent gases discharged from the metallizing zone are flowed. The resulting nickel coated filament may be cut into fibers for use as a reinforcement in composite materials such as those utilized in electromagnetic inteference (EMI) shielding applications.

9 Claims, 1 Drawing Sheet

METHOD FOR METALLIZING FILAMENTS

CROSS-REFERENCE TO RELATED APPLICATION

Concurrently filed herewith on Sept. 26, 1986 is a related application of Ward C. Stevens, U.S. Ser. No. 06/912,964 now U.S. Pat. No. 4,738,896, entitled "SOL GEL FORMATION OF POLYSILICATE, TITANIA, AND ALUMINA INTERLAYERS FOR ENHANCED ADHESION OF METAL FILMS ON SUBSTRATES", and assigned to the assignee of this application.

BACKGROUND OF THE INVENTION

1. Field of the Invention

This invention relates to apparatus and method for metallizing filaments.

2. Description of the Related Art

In a variety of structural and functional applications in which filaments are employed, it is necessary and/or desirable to provide metal coatings, for example, thin films of nickel, gold, copper, silver, and the like, on the substrate. Examples of such applications include optical transmission fibers, conductive fillers and reinforcing media for composite materials.

Particularly in composite materials applications, for example in electromagnetic interference (EMI) shielding applications, where metal-coated fibers, for example of glass or ceramics, are employed as the discontinuous phase for reinforcement of continuous phase matrix materials such as thermoplastic resins, it is critically important that the metal coating has a high degree of adhesion to the substrate.

Good adhesion of the metal coating is necessary in such applications in order that the metallic film be continuous in the final cured composite on the associated reinforcement elements (e.g., glass fibers).

Continuous metallic coatings are in turn essential in the aforementioned composites applications, since any discontinuities will lower the electrical conductivity of the composite. In general, the more highly conductive a composite is, the greater is its ability to provide effective EMI shielding.

In composite applications where the continuous phase matrix material is a thermosetting material, the presence of the metal-coated fibers therein may permit the matrix resin to be rapidly and uniformly cured by radio frequency or microwave heating of coating metal. It is apparent that the presence of discontinuities in the metal coatings on the fibers will result in corresponding localized absences of the desired heating. This in turn will cause uneven curing rates in the composite, with concomitant localized stresses therein and decreased mechanical properties for the composite as a whole.

Finally, the adhesion of the metal coating to the associated fiber substrate must be satisfactory to withstand the abrading and shear to which the coated fibers are subjected in forming the composite.

Specifically, fiber-reinforced composites are typically made by dispersing reinforcing fibers into the matrix resin with a mixing means such as a Brabender single screw extruder or a Werner-Pfleiderer twin screw extruder. During such dispersion, the metal coated fibers encounter substantial abrasion and shear via contact with one another. If the metal coating on the fibers is not strongly adherent in character, such contacts will propagate peeling, pitting, or other delamination of the metal coating, with the aforementioned deleterious consequences on the performance and properties of the composite.

Japanese Kokai Tokkyo Koho No. 60/189105 discloses a conductive composite material, suitable for use in electromagnetic shielding applications, which consists of a thermoplastic resin, e.g., polystyrene, containing 5-40 weight percent of a conductive filler such as copper fibers, and 0.3-10 weight percent of a material for preventing the conductivity of the composite from deteriorating, such as glass fibers coated with tin, nickel, aluminum, or the like.

Japanese Kokai Tokkyo Koho No. 60/65179 discloses the use of nickel coated glass fibers in EMI shielding composites. The nickel coated fibers are prepared by soaking them in titanium sulfate, followed by calcining to form titanium dioxide coatings. The fibers next are soaked in aqueous stannous chloride-hydrochloric acid solutions, washed, activated in aqueous palladium chloride-hydrochloric acid solution to precipitate palladium on the fibers, and washed. Finally, the fibers are chemically plated with nickel using an aqueous solution of nickel sulfate, nickel citrate, sodium hypophosphate, sodium acetate, and ammonium chloride.

Japanese Kokai Tokkyo Koho No. 60/77151 describes electroless coating of glass fibers with conductive metal films, e.g., of nickel, copper, cobalt, iron, and alloys of nickel-copper, nickel-phosphorus, cobalt-phosphorus, cobalt-nickel-phosphorus, iron-nickel, and iron-cobalt, after sensitizing the glass substrate in an aqueous stannous chloride solution, and activated in an aqueous palladium chloride solution.

Spinning and subsequent metal coating of glass optical fiber preforms in vacuo is taught in Japanese Kokai Tokkyo Koho No. 57/156341. Disclosed metals include aluminum, nickel, and tin.

Japanese Kokai Tokkyo Koho No. 57/39284 discloses the electroless plating of glass fibers, after their immersion in an aqueous palladium nitrate solution and heat treatment, e.g., for 30 seconds at 400 degrees Centrigrade. Nickel is mentioned as an example of the electrolessly plated metal.

Schladitz U.S. Pat. Nos. 4,096,823 and 4,097,624 disclose an apparatus and method for metallizing filaments such as glass, in a two-chamber system. In the first chamber, the filament drawn therethrough is impinged with plural streams of heated inert gas to "decontaminate", i.e., clean, its surface. In the second chamber, the hot, decontaminated filament is impinged upon by a gaseous, thermally decomposable metal compound in plural streams, to thermally decompose the compound and metallize the filament.

The techniques utilized in accordance with the above-discussed references for metallizing substrates are all characterizable by various deficiencies, such as inadequate adhesion of the metal coating to the substrate and/or expensive, time-consuming, or complex processing requirements.

Accordingly, it would be a significant advance in the art to provide apparatus and method for providing metal coatings on filament substrates, in a readily achieved, simple and inexpensive manner.

SUMMARY OF THE INVENTION

In one aspect, the present invention relates to an apparatus for metallizing a filament, including:

(i) a metallizing chamber;
(ii) means for introducing a thermally decomposable gaseous compound into the chamber;
(iii) means for passing the filament through the chamber;
(iv) means for heating the filament in the chamber; and
(v) means for discharging effluent gases from the chamber;

wherein the improvement comprises as the heating means (iv) an infrared radiation heating source, and the metallizing chamber being constructed at least partially of an infrared radiation-transmissive material and arranged to present an infrared radiation-transmissive portion of the chamber to the infrared heating source, for transmission of infrared radiation from the heating source through the radiation-transmissive portion to filament passed by means (iii) through the chamber.

Another aspect of the invention relates to apparatus as described above, wherein the infrared radiation-transmissive material is selected from the group consisting of: densified polycrystalline magnesium oxide; zinc sulfide; zinc selenide; sodium chloride; potassium bromide; silver chloride; calcium fluoride; thallium bromoiodide; alumina; and sapphire.

In another aspect, the invention relates to a method for metallizing a filament, by the steps of:
(i) providing a metallizing zone;
(ii) passing the filament through the metallizing zone;
(iii) heating the filament in the metallizing zone;
(iv) flowing a thermally decomposable gaseous metal compound into the metallizing zone; and
(v) discharging effluent gas from the metallizing zone;

wherein the improvement comprises:
enclosing the metallizing zone with a chamber constructed at least partially of an infrared radiation-transmissive material to provide an infrared radiation-transmissive portion of the chamber;
generating infrared radiation; and
directing the generated infrared radiation through the radiation-transmissive portion of the chamber for the heating of the filament in the metallizing zone.

In another aspect of the invention relating to the method as described above, the infrared radiation-transmissive material is selected from the group consisting of: densified polycrystalline magnesium oxide; zinc sulfide; zinc selenide; sodium chloride; potassium bromide; silver chloride; calcium fluoride; thallium bromoiodide; alumina; and sapphire.

A further aspect of the invention relates to an apparatus for metallizing a filament, including:
(i) a metallizing chamber;
(ii) means for introducing a thermally decomposable gaseous metal compound into the chamber;
(iii) means for passing the filament through the chamber;
(iv) means for heating the filament in the chamber; and
(v) means for discharging effluent gases from the chamber;

wherein the improvement comprises:
(A) the introduction means (ii) and the discharging means (v) being coupled to one another as part of a re-recirculation flow circuit;
(B) a fluidization bed of particulate nickel disposed in the flow circuit having an inlet end joined in flow communication with the discharging means (v) and an outlet end joined in flow communication with the introducing means (ii);
(C) a source of carbon monoxide; and
(D) means for feeding carbon monoxide from the source into the flow circuit upstream of the fluidization bed for flow through the fluidization bed.

Yet another aspect of the invention relates to a method for metallizing a filament, including the steps of:
(i) providing a metallizing zone;
(ii) passing the filament through the metallizing zone;
(iii) heating the filament in the metallizing zone;
(iv) flowing a thermally decomposable gaseous metal compound into the metallizing zone;
(v) discharging effluent gases from the metallizing zone;

wherein the improvement comprises:
(A) providing a fluidizable bed of particulate nickel;
(B) flowing the effluent gases discharged from the metallizing zone, together with make-up carbon monoxide as required, into the fluidizable bed for fluidization of the particulate nickel therein and reaction of the fluidizing gas carbon monoxide with nickel to form gaseous nickel carbonyl as the thermally decomposable gaseous metal compound; and
(C) discharging nickel carbonyl-containing gas from the fluidized bed for flow into the metallizing zone.

DETAILED DESCRIPTION OF THE INVENTION, AND PREFERRED EMBODIMENTS

Figure 1:
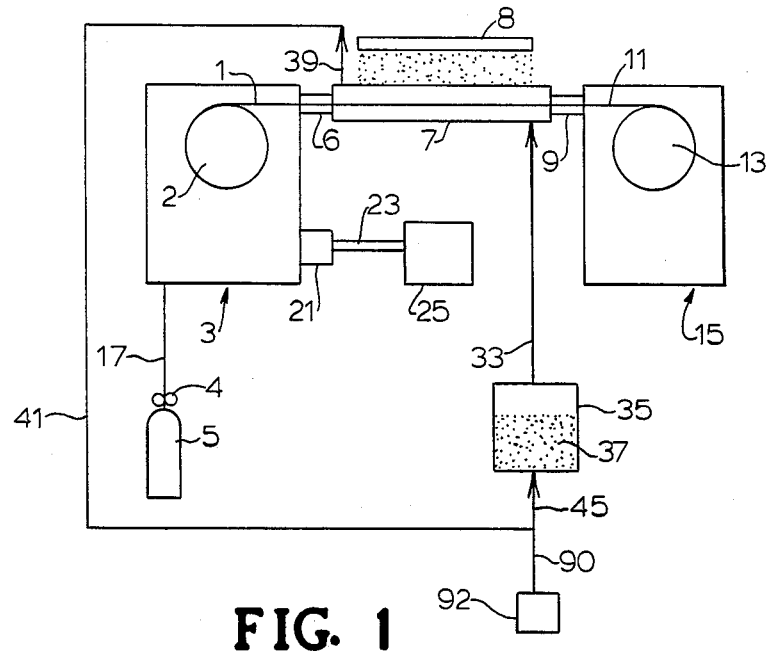
FIG. 1 is a schematic representation of a process system for metallizing filament according to an illustrative embodiment of the apparatus and method of the present invention.

The filaments which are usefully employed in connection with the present invention may be formed of any suitable material which may advantageously be metallized, i.e., coated with a metal, such as for example natural or synthetic, glasses, ceramics, and the like. Examples of these materials include glasses such as conventional silica glass and borosilicate glasses, and ceramics such as mullite, alumina, silicon carbide, silicon nitride, etc.

A particularly useful application for metal-coated filaments produced by the method and apparatus of the invention is in material composites, especially in composites employed for structural elements in EMI shielding applications. For such usage, the filament may advantageously be in the form of chopped or otherwise discrete fibers, as produced by cutting the metallized filament produced in the practice of the invention.

The metal coating on the filaments produced by the invention may be any suitable metal element, alloy, organometallic complex, etc., having appropriate compatibility with and adhesion to the filament. Illustrative of metals which may advantageously be employed are nickel, copper, aluminum, gold, silver, platinum, palladium, tellurium, rhodium, lead, cobalt, iron, and compatible alloys and compounds thereof, which are capable of being provided to the metallizing chamber in the form of a thermally decomposable compound containing such metal, which in the presence of a heated filament of sufficient temperature will thermally decompose to yield a deposit of the elemental metal on the filament substrate.

In accordance with a particularly advantageous embodiment of the invention, an interlayer, i.e., an intermediate layer, is employed between the substrate and the metal coating, to provide for enhanced adhesion of the metal coating to the filament. This of course requires that the interlayer be of a material which itself is suitably adherent to the substrate as well as to the metal coating.

Interlayers meeting the above criteria may readily be formed, comprising a material selected from the group consisting of polysilicate, titania, and alumina.

The interlayer feature is more fully described in the copending application U.S. Ser. No. 06/912,964, filed concurrently herewith on Sep. 26, 1986 in the name of Ward C. Stevens, and entitled "SOL GEL FORMATION OF POLYSILICATE, TITANIA, AND ALUMINA INTERLAYERS FOR ENHANCED ADHESION OF METAL FILMS ON SUBSTRATES". The disclosure of this copending application is hereby incorporated herein by reference.

The interlayer may be formed on the substrate in any suitable manner, e.g., by electrolytic methods, chemical vapor deposition, etc., but it is preferred to form the interlayer on the substrate by application thereto of a sol gel dispersion of the polysilicate, titania, or alumina.

After the applied sol gel dispersion is dried, the metal coating may be formed on the interlayer-coated filament by chemical vapor deposition of the elemental metal in the manner herein disclosed.

Regardless of whether the filament is provided with an interlayer or other surface-applied intermediate material, the filament may require other preliminary treatment steps to ready it for the metallization process.

For example, glass and other filaments as originally provided may have a sizing or other protective coating on its surfaces, so that an initial desizing step at elevated temperature may be necessary to remove such material and render the substrate free of matter which would hinder or otherwise adversely affect the adhesion of the metal coating to the filament.

In addition to interlayer formation, the adhesion of the metal coating to the filament may be enhanced through other treatment operations, such as for example, chemical etching of the surface to be metal coated, flame spraying thereof, mechanical surface roughening (abrading), etc.

As indicated above, the metal coating is preferably applied to the filament in the practice of the invention by chemical vapor deposition from a thermally decomposable compound comprising the metal. This is highly advantageous in the case of metals, such as nickel, which form easily thermally decomposable compounds, e.g., nickel carbonyl, which facilitate the use of chemical vapor deposition.

It will be appreciated that the thickness of the metal coating may be varied widely, to provide a metallized layer most appropriately dimensioned to the end use application intended for the metal-coated filament.

In applications where the metal-coated filament produced by the method and apparatus of the invention is employed in EMI shielding applications, it will in general be satisfactory to provide the metal coating with a thickness of from about 0.01 to about 3.0 microns.

As an example of a specific article, nickel-coated glass filament for EMI shielding applications may feature a nickel coating with a thickness of from about 0.1 to about 1.0 micron, optionally with a polysilicate interlayer having a thickness of from about 100 to about 1000 Angstroms.

A preferred application for metal-coated glass filaments made by the method and apparatus of the invention is as reinforcing media in material composites for EMI shielding. In such composites, the metal-coated glass fibers, or scrim or fabric formed therefrom, form the discontinuous phase of the composite, in a continuous phase matrix material, e.g., a thermoplastic resin.

Structural elements, suitable for use in an EMI environment, may be formed of such material composites, which contain an EMI shieldingly effective amount of the metal-coated fibers.

As used in such context, "an EMI shieldingly effective amount" refers to the amount of metal-coated fibers in the composite which provides a predetermined necessary or desirable level of electromagnetic interference attenuation, when the structural element is employed in an EMI environment for such purpose.

Referring now to the drawings, FIG. 1 is a schematic representation of a process system for metallizing filament according to an illustrative embodiment of the present invention.

The filament 1, e.g., a glass or ceramic filament, is processed in a series of chambers, including chamber 3, an unspooling chamber; chamber 7, a metallization chamber; and chamber 15, a spooling chamber for the metallized filament. The chambers are isolated from the ambient environment, so that air, air-borne dust, and other contaminants do not foul the filament surface and interfere with the subsequent metallizing operation.

Further, to keep the filament surface to be plated free of adsorbed or chemisorbed gas species, which may interfere with the plating operation or the subsequent performance of the metal-coated filament, this series of chambers is provided with a valve 21 communicating with conduit 23 which in turn is joined to vacuum pump 25 which may be used to evacuate the aforementioned chambers. After the chambers are evacuated, valve 21 can be closed and valve 24 can be opened, allowing effectively inert gas, e.g., nitrogen, helium, argon, carbon monoxide, etc., to backfill the chambers.

Filament from the source chamber 3 is passed through transfer conduit 6 into the metallizing chamber 7 for metal coating therein.

A thermally decomposable gaseous metal compound is introduced to the metallizing chamber 7 by feed conduit 33. In the metallizing chamber, the filament is heated to sufficient temperature so that when the filament is impinged on by the decomposable gaseous metal compound, the compound is thermally decomposed to deposit elemental metal on the filament's surface. The at least partially decomposed, metal-depleted plating gas effluent then is discharged from the metallizing chamber in discharge conduit 39.

It is a specific feature in one aspect of the present invention that the means for heating the filament which is plated in the metallizing chamber is an infrared (IR) heat source 8, which may be of any conventional type capable of providing IR radiation to the filament in sufficient intensity, at a sufficient wavelength range, and at a sufficient flux to raise the surface temperature of the filament to a level providing for thermal decomposition of the gaseous metal compound coming into contact therewith. Examples of illustrative IR radiation source elements include conventional quartz IR lamps, heated incandescent filaments, resistance heated wires, etc.

In connection with the use of an IR radiation heating source for heating the filament to be plated, it is also a specific requirement that the metallizing chamber itself is constructed at least partially of an IR radiation-transmissive material, and arranged to present an IR radiation-transmissive portion of the chamber to the IR heating source, for transmission of the IR radiation from the heating source through the radiation-transmissive portion of the metallizing chamber to the filament being passed through the chamber.

Thus, the metallizing chamber will be constructed with at least an IR radiation transmissive wall, window, or other portion through which radiation from the IR heating source can pass to impinge on the filament, for heating thereof. It may be desirable in some instances to fabricate the entire metallizing chamber of an IR radiation transmissive material, but in most instances it will be satisfactory if only the portion of the chamber which is presented to the IR radiation source is formed of the material.

The IR radiation-transmissive material may be of any type which is suitably transmissive to IR radiation so as to permit the filament disposed on the opposite side thereof from the radiation source to be heated by the incident radiation passing therethrough. Particularly suitable materials of such type may include: fully densified polycrystalline magnesium oxide; zinc sulfide; zinc selenide; sodium chloride; potassium bromide; silver chloride; calcium fluoride; thallium bromoidide; alumina; and sapphire.

A preferred IR radiation-transmissive material is the fully densified polycrystalline magnesium oxide material which is commercially available in sheet form under the trademark "IRTRAN". A suitably shaped sheet of this material may be employed as an IR radiation-transmissive "window" in the construction of the metallizing chamber, as in FIG. 1.

The filament being drawn through the metallizing chamber 7 is coated with elemental metal from the decomposition of the gaseous metal compound passed therethrough. The resulting metallized filament 11 then is passed through the transfer conduit 9 into chamber 15 for collection on take-up roll 13 disposed therein.

As a specific feature according to another aspect of the present invention, the nickel carbonyl plating gas which is introduced to the metallizing chamber 7 in this illustrative embodiment is provided by a fluidization vessel 35 which receives carbon monoxide from a carbon monoxide source 92 via feed conduits 90 and 45.

The metal-depleted effluent gases discharged from the metallizing chamber 7 in conduit 39 are recycled in a recirculation loop, or circuit, comprising conduits 39, 41, and 45, to recover the carbon monoxide content thereof, with make-up carbon monoxide being added as necessary from the source 92.

The fluidization vessel 35 contains a fluidizable bed 37 of particulate nickel, which is fluidized by the combined gas stream entering the bottom of the vessel from conduit 45. In the fluidized bed, the carbon monoxide fluidizing gas reacts with the particulate nickel to form nickel carbonyl as a reaction product.

According to this aspect of the invention, the nickel carbonyl employed in the metallizing step is generated in situ in the process system, which avoids the need for transport and handling of this volatile and toxic gas, so that safety in the operation of the system is enhanced. In the metallizing chamber, the nickel carbonyl is readily decomposed at temperatures on the order of 140-170 degrees C. to lay down pure (elemental) nickel on the substrate, and the carbon monoxide by-product of the decomposition is recycled in the recirculation circuit for generation of additional nickel carbonyl in the fluidized bed 37.

It will be apparent from the foregoing that the features of the invention described in connection with FIG. 1, i.e., (1) the use of an IR radiation source as the heating means for the filament in the metallizing chamber, in conjunction with the use of an IR radiation-transmissive material of construction for the metallizing chamber, and (2) the insitu fluidized bed generation of nickel carbonyl as a plating gas for deposition of nickel in the metallizing chamber, may be used in combination with one another as well as separately and independently of one another.

Figure 2:
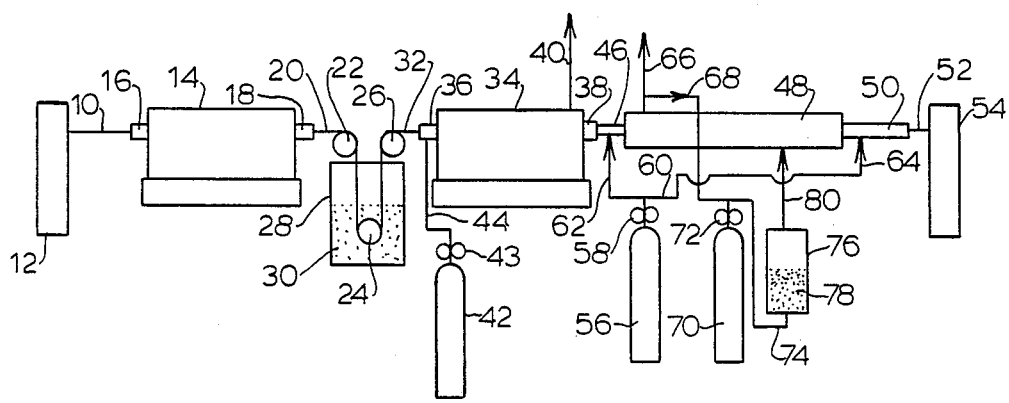
FIG. 2 is a schematic representation of a process system for metallizing filament according to another embodiment of the invention, in which the process system comprises means for applying to the filament an interlayer derived from a sol gel, to enhance the adhesion of the metal coating on the filament.

FIG. 2 is a schematic representation of a process system for metallizing filament according to another embodiment of the invention, in which the process system comprises means for applying to the filament an interlayer derived from a sol gel, to enhance the adhesion of the metal coating on the filament.

As shown, glass filament 10, from a source 12 of same, enters the system and passes into the desizing furnace 14 provided with an inlet seal 16 and an outlet seal 18, through which the filament is respectively drawn.

In the desizing furnace, the filament is subjected to elevated temperature conditions below the melting point of the glass, but sufficiently high to degass the filament surface and remove any sizing (e.g., starches, thin film epoxies, waxes or polymeric protective coatings) therefrom.

Upon exiting the furnace, the desized glass filament 20 is conveyed, by means of synchronously rotated rollers 22, 24, and 26, through vessel 28 containing therein a volume of a sol gel dispersion of a polysilicate, titania, or alumina material, so that the glass filament is dip coated with the sol gel dispersion. The sol gel dispersion may comprise an aqueous solution of ethanol as the solvent component thereof.

The dispersion-coated filament 32 thereupon enters the dehydration furnace 34, equipped with inlet seal 36 and exit seal 38. Compressed air, from source tank 42, is flowed through flow control valve 43 and conduit 44 into the dehydration furnace, where it circulates in contact with the filament to remove volatile components from the applied dispersion. The resulting volatiles-containing air is discharged from the furnace in effluent conduit 40.

The drying of the sol gel dispersion in the dehydration furnace provides the interlayer on the filament. This filament passes in transfer conduit 46 into the metal coating chamber 48 in which a nickel coating is applied to the interlayer-coated filament.

The resulting nickel-coated glass filament is discharged from the metal coating chamber in transfer conduit 50 as product filament 52 and passed to the collection means 54.

In the metallizing chamber, the filament while still at elevated temperature from the dehydration furnace, is impinged with a gaseous stream of nickel carbonyl, which causes this gaseous compound to thermally decompose and elemental nickel to deposit on the interlayer-coated substrate.

The nickel carbonyl source gas is generated in vessel 76 containing a fluidized bed of nickel granules 78. The bed is fluidized with a gas comprising carbon monoxide furnished from cylinder 70, and flowed therefrom through flow control valve 72 and conduit 74 into the lower end of vessel 76.

In the fluidized bed, the carbon monoxide reacts with the granular nickel to form gaseous nickel carbonyl, which is flowed in discharge conduit 80 into the metallizing chamber 48. Subsequent to its decomposition in the chamber, the nickel-depleted gas is discharged from the chamber in effluent conduit 66, with a portion thereof being recirculated in recycle conduit 68 to join with the carbon monoxide from cylinder 70 to form the fluidizing gas.

Because nickel carbonyl is toxic in character, an inert gas curtain is provided at each end of the metal coating chamber 48. Inert gas, e.g., nitrogen, is flowed from a source cylinder 56 through flow control valve 58 into gas manifold conduit 60, from which the gas is introduced in branch lines 62 and 64 into the transfer conduits 46 and 50, respectively. In such manner, the metallizing chamber is pressure-balanced at its extremities by the inert gas so no net efflux of nickel carbonyl from the chamber to the external environment takes place.

It will be appreciated that the gas discharged in effluent conduit 66, containing carbon monoxide and minor amounts of nickel carbonyl, may advantageously be passed to solvent washing or other treatment steps, to effect the recovery of the nickel content of this stream and the carbon monoxide component thereof, for reuse in the system.

The sol gel-derived interlayer coatings in accordance with the present invention are strongly adherent to the glass substrate as a result of bonding interaction between hydroxyl functional groups on the glass substrate surface and esters and/or metalorganics in the sol. By proper choice of pH of the sol, the porosity of the interlayer coating, as dried, can be varied. The drying conditions may also be varied to vary the porosity of the interlayer. The porosity of the interlayer is readily determined by standard porosimetry techniques, so that one of ordinary skill may easily determine the sol pH and drying conditions necessary to obtain a desired porosity, without undue experimentation.

When the interlayer-coated glass substrate is coated with metal, the metal penetrates into the pores of the interlayer to provide a high degree of mechanical interlocking between the metal coating and the interlayer, while concurrently, chemical bonds between the interlayer material and the glass substrate provide good adhesion of the interlayer to the substrate.

It is within the purview of the present invention to modify the chemical composition of the sol gel dispersion to provide covalent or associative bonding of the metal coating to the interlayer, or to provide for enhanced infrared or microwave radiation absorption by the interlayer, as a means of heating the substrate to facilitate drying of the applied sol gel dispersion, and the decomposition of a gaseous metal compound, if chemical vapor deposition is employed to apply the metal coating to the interlayer.

The features and embodiments of the invention are more fully shown hereinafter with reference to the following non-limiting examples.

EXAMPLE I

Following the procedure generally disclosed in Nogami, et al., *J. Non-Cryst. Solids*, 37, 1980, pp. 191–201 for glass formation by the hydrolysis of tetraethylorthosilicate with ammonium hydroxide, samples were prepared by mixing 10 moles of water with 1 mole of tetraethylorthosilicate and 0.15M ammonium hydroxide. This solution was allowed to gel.

TEM examination of the gel showed particles of approximately 200 Angstroms diameter, with pores ranging from 20 to 100 Angstroms. TEM examination of a corresponding glass formed from this gel, after heating to 1000 degrees C., still showed particles having a diameter of almost 200 Angstroms.

EXAMPLE II

In order to evaluate the efficacy of interlayers for enhancement of adhesion and to test a suitable process for metal plating, baseline experiments were conducted based on the teachings of Schladitz U.S. Pat. No. 4,097,624. No attempt was made to duplicate the specific apparatus described in this patent, but conditions disclosed therein for nickel carbonyl decomposition and nickel plating were found to be useful.

An apparatus was assembled comprising three chambers, a first bubbler chamber immersed in an ice water bath, a second chemical vapor deposition (CVD) chamber wrapped with heating tape to maintain a temperature of 146 degrees C. therein, and a third scrubbing chamber comprising a copper conduit wrapped with heating tape to maintain a temperature of approximately 190 degrees C. therein and positioned with its outlet end submerged in a mineral oil bath. The second CVD chamber contained a glass rod plating substrate, a portion of which was abraded to simulate a roughened surface.

The three chambers were joined in gas flow communication with one another, and the first chamber was in turn joined to a source vessel of nitrogen and a source vessel of nickel carbonyl in carbon monoxide at 1 atm. pressure, feeding independently into a common inlet conduit to the first chamber.

The entire system was first flushed with nitrogen for a period of approximately one hour prior to filling the bubbler in the first chamber with nickel carbonyl. During the flushing step, the second and third chambers were heated to 146 degrees C. and 190 degrees C., respectively.

Approximately 0.1 ml. of the gaseous nickel carbonyl was transferred to the bubbler, and the associated source vessel then was closed. Nitrogen was introduced from its source vessel to the bubbler, for use as a carrier gas for the nickel carbonyl gas already fed into the system. After approximately two minutes no nickel carbonyl remained in the system.

Nitrogen flow then was allowed to continue, to purge the system. After about 45 minutes, the heaters were turned off and the CVD chamber was inspected. A bright nickel film was found to be deposited uniformly along the length of the CVD chamber, and on the glass rod in the chamber.

As viewed under a stereomicroscope (40X magnification), nickel was found to be plated on both abraded and unabraded portions of the glass rod. On both surface portions, the deposited nickel had a grainy appearance. With some force, the nickel coating could be removed from the unabraded portion, but could not be removed from the abraded portion, which had been prepared by rubbing the rod portion with a 220 grit sand paper.

These observations show that adhesion to glass fiber can be promoted by mechanically interlocking the metal coating to the glass fiber.

EXAMPLE III

In Brinker et al., *J. Non-Cryst. Solids,* 48, 1982, pp. 47-64, methods are described for making gels which result in various microstructures, using a two-step hydrolysis procedure in which relative rates of hydrolysis and condensation are varied. Microstructure development by these methods is related to gel formation which depends on (1) hydrolysis of alkoxide groups to form silanols, (2) condensation of silanols to form silicate polymers, and (3) linking of polymers to form gels.

The relative rates of these steps (1)-(3) depend on the concentration of water and the tetraalkylorthosilicate in the reaction system, and the pH of the reaction volume.

Sample C was prepared according to the formulation set out in Table I below, to duplicate sample A3 described in the Brinker, et al. article.

TABLE I

| Sample C | |
|---|---|
| Component | Concentration mole % |
| tetraethylorthosilicate | 6.1 |
| water | 75.5 |
| n-propanol | 18.4 |
| HCl | 0.005 |

Following the procedure in the Brinker, et al. article, the silicate starting material, alcohol, water, and acid were initially mixed in the mole ratio of 1:3:1:0.0007, as a mixture of 22 gm propanol, 22.4 gm silicate, 1.9 gm water, and 0.0026 gm acid.

This initial mixture was stirred for 1.5 hour at approximately 60 degrees C. 16.5 ml of water was added and the mixture was stirred at room temperature for approximately 5 hours.

A glass rod was dipped in the resulting sol. The wetting appeared good, and the coated rod was dried overnight at 200 degrees C.

When the coated glass rod was removed from the oven, interference colors were observed toward the top portion of the rod. Examination under a stereomicroscope at 40X revealed the lower portion of the rod to have a cracked film which was non-adherent. The upper rod portion, however, showed an adherent and scratch-resistant (when scratched with metal forceps) film. These observations were due to the fact that the coated rod was dried in a vertical position, and in spite of the low viscosity of the sol the coating was significantly thicker on the lower portion of the rod than on the upper portion thereof. The consequently larger shrinkage stresses on the lower portion of the rod caused the coating to be poorly adherent.

The coated rod, along with some Pyrex® glass wool, sliver 8 micron, was placed in a 6 mm Pyrex® tube for metal coating. The coating apparatus described in Example III was employed for the metallization of the rod, modified with the addition of a temperature controller to regulate the temperature in the coating chamber, and with the addition of nitrogen to the nickel carbonyl/nitrogen stream to dilute the metal compound.

The metal coating chamber was maintained at 145 degrees C. The entire assembly was purged with nitrogen only, for about 45 minutes, and nitrogen gas flow was then discontinued. Approximately 0.1-0.2 ml of nickel carbonyl then was introduced to the system, and nitrogen flow was resumed. Nickel carbonyl was evaporated in about 45 seconds, during which time the temperature in the metal coating chamber dropped by about 5 degrees C.

Nitrogen flow was continued in the system for 0.5 hour, and then the system heaters were turned off. After 2 hours, the metal coating chamber was disassembled and its contents examined.

Study of the glass rod under the microscope showed nickel deposition to be the same on sol coated, as well as uncoated, areas. More force was required to remove the nickel film from the sol gel coated glass substrate, than from the portions of the glass substrate containing no sol gel coating. The mechanism of nickel removal by scratching (using a metal forceps as the scratching implement) appeared to be different in the sol gel coated, and non-coated areas; on the sol coated areas, complete removal of the nickel film from the glass substrate appeared to require the removal of the sol coating as well, whereas on the non-coated areas (bare glass without sol gel coating) the nickel film readily peeled away on scratching.

This example shows the effective of sol gel films in enhancing the adhesion of metal coatings on glass substrates in the manner of the present invention.

While preferred and illustrative embodiments of the invention have been described, it will be appreciated that numerous modifications, variations, and other embodiments are possible, and accordingly, all such apparent modifications, variations, and embodiments are to be regarded as being within the spirit and scope of the invention.

What is claimed is:

1. In a method for metallizing a filament, including the steps of:
    (i) providing a metallizing zone;
    (ii) passing the filament through the metallizing zone;
    (iii) heating the filament;
    (iv) flowing a thermally decomposable gaseous metal compound into the metallizing zone;
    (v) contacting the heated filament in the metallizing zone with the thermally decomposable gaseous metal compound to decompose the gaseous metal compound and deposit metal on the heated filament; and
    (vi) discharging effluent gases from the metallizing zone;

the improvement comprising:
    (A) applying to the filament, prior to its passage through the metallizing zone, a polysilicate, titania, or alumina sol gel dispersion coating;
    (B) drying the sol gel dispersion-coated filament at elevated temperature to form a porous interlayer coating thereon;
    (C) introducing the porous interlayer-coated filament while still at elevated temperature from the drying step into the metallizing zone;
    (D) providing a fluidizable bed of particulate nickel;
    (E) flowing at least a portion of the effluent gases discharged from the metallizing zone, together with make-up carbon monoxide as required, into the fluidizable bed for fluidization of the particulate nickel therein and reaction of the fluidizing gas carbon monoxide with nickel to form gaseous nickel carbonyl as the thermally decomposable gaseous metal compound; and (F) discharging nickel carbonyl-containing gas from the fluidized bed for flow into the metallizing zone, for decomposition therein to deposit nickel on the porous interlayer-coated filament, whereby a high degree of mechanical interlocking between the nickel coating and the interlayer is achieved.

2. A method according to claim 1, comprising the further steps of:

enclosing the metallizing zone with a chamber constructed at least partially of an infrared radiation-transmissive material to provide an infrared radiation-transmissive portion of the chamber;

generating infrared radiation; and directing the generated infrared radiation through the radiation-transmissive portion of the chamber for heating of the filament in the metallizing zone.

3. A method according to claim 2, wherein the infrared radiation-transmissive material is selected from the group consisting of: densified polycrystalline magnesium oxide; zinc sulfide; zinc selenide; sodium chloride; potassium bromide; silver chloride; calcium fluoride; thallium bromoiodide; alumina; and sapphire.

4. A method according to claim 1, wherein the filament is formed of a material selected from the group consisting of glasses and ceramics.

5. A method according to claim 1, wherein the metallized filament is cut to form discrete fibers, and incorporated in a composite material.

6. A method according to claim 1, wherein the metal coating on the metallized filament has a thickness of from about 0.01 to about 3.0 microns.

7. A method according to claim 1, wherein the interlayer is a polysilicate interlayer having a thickness of from about 100 to about 1,000 Angstroms, and wherein said nickel coating has a thickness of from about 0.1 to about 1.0 micron.

8. A method according to claim 1, wherein the filament is a glass filament, and wherein the metal-coated glass filament is cut into fibers, and said fibers are dispersed in a thermoplastic resin continuous phase matrix material, to form a composite material comprising the metal-coated glass fibers as reinforcing media.

9. A method according to claim 1, wherein temperature in the metallizing zone is between 140° and 170° centigrade.

* * * * *

UNITED STATES PATENT AND TRADEMARK OFFICE
CERTIFICATE OF CORRECTION

PATENT NO.   :   4,759,950

DATED        :   July 26, 1988

INVENTOR(S)  :   Ward C. Stevens

It is certified that error appears in the above-identified patent and that said Letters Patent is hereby corrected as shown below:

On the title page, after "[73] Assignee:," change "Advance" to --Advanced--.

Column 8, line 19 change "insitu" to --in-situ--.

Signed and Sealed this

Third Day of October, 1989

Attest:

DONALD J. QUIGG

*Attesting Officer*         *Commissioner of Patents and Trademarks*